Dec. 8, 1964 T. A. TELFER 3,159,906

ELECTRIC CIRCUIT ASSEMBLY METHOD

Filed May 27, 1957 2 Sheets-Sheet 1

INVENTOR:
THOMAS A. TELFER,

BY Hugo M. Wikstrom
HIS ATTORNEY.

Dec. 8, 1964 T. A. TELFER 3,159,906

ELECTRIC CIRCUIT ASSEMBLY METHOD

Filed May 27, 1957 2 Sheets-Sheet 2

INVENTOR:
THOMAS A. TELFER,
BY Hugo M. Wikstrom
HIS ATTORNEY.

United States Patent Office 3,159,906

Patented Dec. 8, 1964

3,159,906

ELECTRIC CIRCUIT ASSEMBLY METHOD

Thomas A. Telfer, Rensselaer, N.Y., assignor to General Electric Company, a corporation of New York Filed May 27, 1957, Ser. No. 661,717
5 Claims. (Cl. 29—155.5)

This invention relates to the art of assembling an electric circuit, and more particularly to the art of assembling electric circuits wherein circuit components are mounted on dielectric panels having a solder adherent, conductive pattern.

In recent years increased emphasis has been placed upon the assembly of electric circuits by mounting components upon dielectric panels containing solder adherent interconnecting patterns to which the components are soldered by various methods including dip soldering. Such dielectric panels, commonly referred to as printed wiring boards, may have a pattern imprinted on one side alone. With such boards mounting of components by insertion of component terminals through holes pierced at predetermined positions on the pattern and subsequent dip soldering of the panel have been unsatisfactory because of the weakness of the mechanical bond between the pattern and the component terminals. This has been caused by the fact that the solder will not wet the dielectric surface through the hole leaving the solder fillet as the only supporting structure between the pattern and the component terminal. The weakness of this mechanical bond is of particular importance in equipments subject to an environment of vibration such as airborne electronic equipment.

Further, the recent accent placed upon decreasing the physical size of electrical circuits has resulted in the use of dielectric panels having patterns formed on both sides of the panel. With such two-sided boards interconnection of the patterns by such means as dip soldering has been extremely difficult. Such interconnections, although in themselves difficult to construct, have been further rendered difficult to manufacture by the requirement that the interconnection serve as a means for mounting component terminals.

The prior art has recognized many of the problems imposed in such assembly methods and has devised solutions thereto. For example, eyelets placed in holes formed at predetermined positions along the pattern on said panels have been used. This solution has not been entirely satisfactory for use with fully automated assembly procedures since the use of eyelets has created special handling problems. The boards with eyelets in place require special handling to prevent inadvertent dislodging of the eyelets from the preformed holes during manufacture. Also difficulty in securing proper electrical connection between the pattern and the eyelet has required mechanical staking or hand soldering for proper electrical junctions. In some methods employed by the prior art tabbed eyelets have been used to increase the surface exposure of the eyelets with respect to the board pattern. However, such eyelets have required special equipment to maintain proper orientation of the tab with the pattern. In all of the methods employed by the prior art separation of the pattern from the dielectric panel has been experienced.

It is, therefore, one object of my invention to provide an improved method for the assembly of electric circuits.

It is a further object of my invention to provide an improved method for the assembly of circuit components to a dielectric panel having a conductive pattern thereon.

It is a still further object of my invention to provide an improved electric circuit assembly method for the mounting of components and the interconnection of patterns imprinted on both sides of a dielectric panel.

In accordance with one embodiment of this invention a complete electrically wired equipment may be assembled by the following processing method, consisting of the steps of forming a solder adherent pattern on a dielectric panel, forcing eyelets through said panel at predetermined points along said pattern, inserting component terminals through said eyelets, and soldering said eyelets to said pattern and said terminals to said eyelets by dip soldering operations.

In accordance with another embodiment of this invention, I place a pre-formed solder washer about the eyelet before forcing the eyelet through the panel. Soldering the eyelets to the terminals and to the conductive patterns on both sides of said panel is performed by a single dip soldering step.

The features of my invention, which I believe to be novel, are set forth with particularity in the appended claims. My invention, itself, however, both as to its organization and method of operation, together with other objects and advantages, may best be understood by reference to the following description taken in connection with the accompanying drawings, in which:

Figures 1, 2:
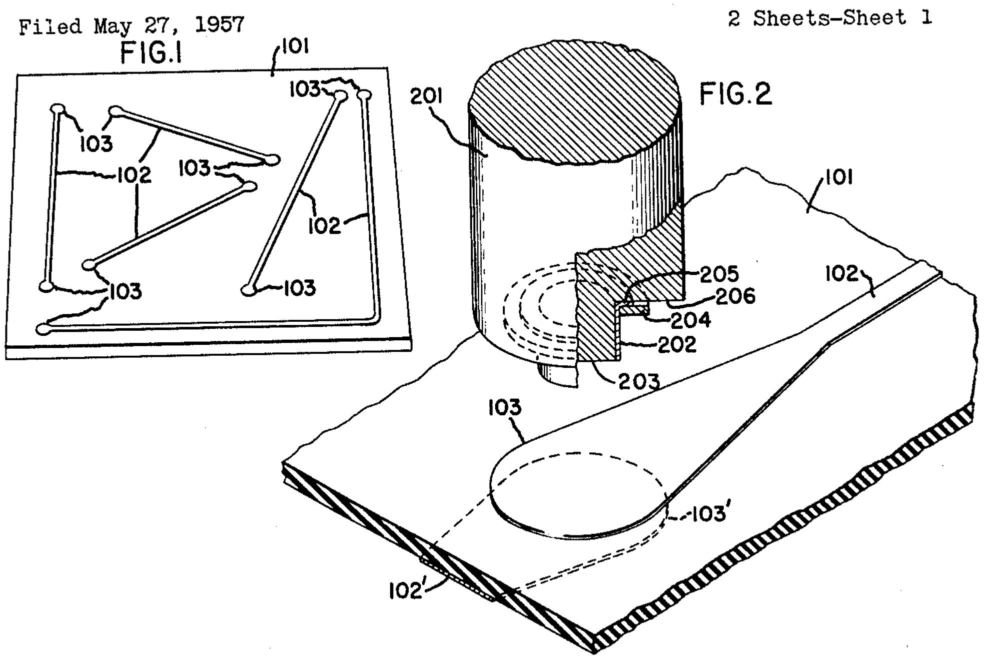
FIGURE 1 is a perspective view of a panel consisting of a conductive pattern imprinted on a dielectric base.
FIGURE 2 is a perspective view of a portion of the panel shown in FIGURE 1 positioned for eyelet insertion.

In FIGURE 1 there is shown a wiring pattern formed on an insulated panel 101. The pattern comprises a plurality of conductive runs 102 terminating in pads 103. The pads are enlarged sections of the conductor pattern to form an area for the connection of components thereto. Since the conductor portion is normally sufficient to carry the electrical currents involved in such equipments when formed of the smaller width, and since it is usually desirable to maintain the width of such conductor runs as small as possible, it has been standard practice to provide such mounting pads 103.

In fabricating the conductive pattern on the insulating panel I prefer to employ the following steps. First, a drawing is made showing the layout of all the conductor runs in the overall circuit intended for single panel. From this drawing a silk screen mask is prepared. A resist is applied through the silk screen mask to all portions of the conductor laminate except where runs are desired. The runs alone are then plated with solder. The resist is then removed and the conductor laminate subjected to a bath in an etching solution. The solution will etch away all of the laminate except the desired runs which are protected by solder.

Alternately other techniques may be employed for the production of the conductor runs such as the electrical deposition of metal, mechanical placement of etched conductors, or metal spraying of the conductor runs through stencils.

The resultant intermediate product illustrated in FIGURE 1 is prepared for component mounting as shown in detail in FIGURE 2.

In FIGURE 2 there is shown the insulated base 101 with the conductor run 102 terminating in pad 103 on one side of the panel. A conductor 102′ terminating in pad 103′ may be formed on the other side of said panel.

The panel is positioned under a punch 201 for positioning of an eyelet 202 within the bounds of pad 103. The eyelet 202 has an axial bore. The punch 201 has a mandrel portion 203 adapted to fit within the axial bore of the eyelet in supporting engagement therewith. A solder washer 204 is securely positioned under the head 205 of the eyelet by frictional engagement of the washer with the periphery of the eyelet wall. This solder washer may be any of the commercially available preformed solder washers which are preferably constructed from laminated layers of solder and flux. The eyelet is forced through the panel by said punch by the force exerted by the thrust face 206 of the punch until the washer 204 contacts the pattern. The positioning is shown in detail in FIGURE 3.

Figure 3:
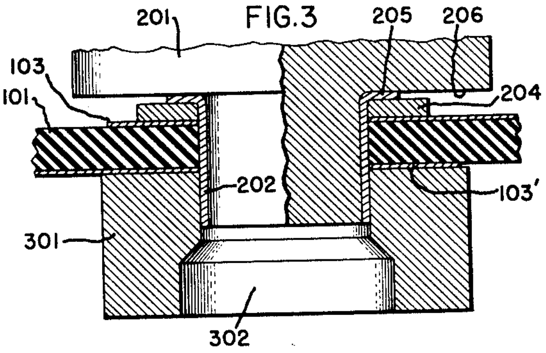
FIGURE 3 is a cross section of an inserted eyelet.

In FIGURE 3 there is shown the punch 201 in the descended position with eyelet 202 forced through the panel 101 including pads 103 and 103'. The solder washer 204 has been forced into engagement with pad 103. A cooperating die structure 301 supports the panel 101 during descent of the die and the punched slug is ejected through the aperture 302 in the die 301. As the punch ascends, frictional engagement of the eyelet 202 with the panel 101 will resist movement of the eyelet, leaving the eyelet properly positioned in the panel.

If the eyelet is used solely to join the conductor runs on either side of the panel by electrically joining pads 103 and 103', the panel can be immediately subjected to a dip soldering operation. In those cases, however, where the eyelet is used not only to interconnect the conductors on either side of the panel, but also to serve as a supporting structure for component terminals, the component terminal is positioned on the panel with the terminal extending through the eyelet. Dependent upon assembly procedures these components may be positioned with respect to the panel by ancillary assembly apparatus or held in position by the frictional forces between the eyelet wall and the terminal. It will also be understood by those skilled in the art that other assembly procedures such as terminal insertion and bending of the portion extending beyond the eyelet for temporary positioning may be employed. The panel with components in place is then subjected to a solder bath dip. Such a dip may be preceded by dipping in flux. This step is illustrated in FIGURE 4.

Figure 4:
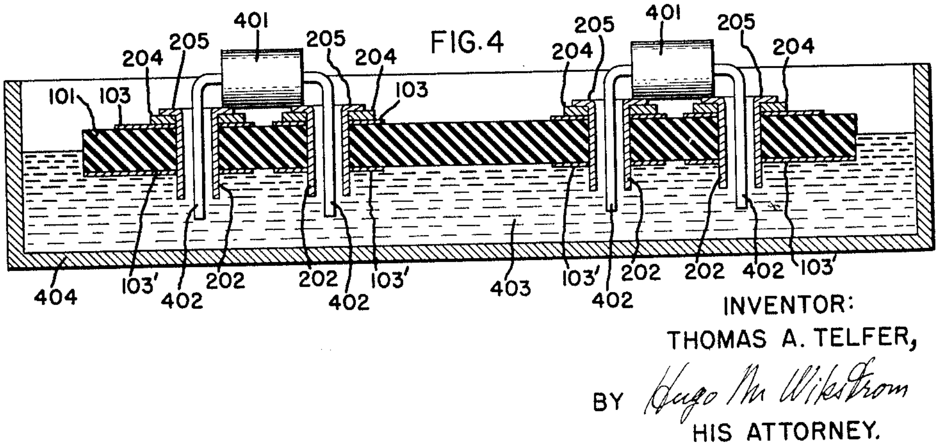
FIGURE 4 is a cross section view illustrating the step of soldering the circuit components to the panel.

In FIGURE 4 there is shown the panel 101 with the components 401 having terminals 402 inserted through the eyelet 202 in the panel. The panel with the components positioned thereon is preferably maintained in a horizontal position, dipped in flux, and then dipped in a molten solder bath. The molten solder 403 may be conventional low melting point solder contained within a suitable container 404 to which heat may be applied to maintain the solder in a fluid state. It will be recognized by those skilled in the art that ancillary equipment such as surface wipers and conveyors for dipping the panel in the solder bath are usually employed in manufacturing procedures. Since such equipment is well known and forms no portion of my invention, it is not illustrated in detail. When the panel is inserted within the molten solder, solder will adhere to the eyelet and pad 103', to form a solid bridge therebetween on removal. The solder will move upwards through the eyelet bore by capillary action and form a solid bond between the eyelet and the component terminal upon removal of the panel form the path. At the same time heat will be transmitted from the molten solder bath through the walls of the eyelet to melt the solder washer 204 which will adhere both to the eyelet walls under the eyelet head and to the pad 103 to form a bond therebetween upon removal from the solder bath. Typical resultant solder bonds are illustrated in FIGURE 5.

Figure 5:
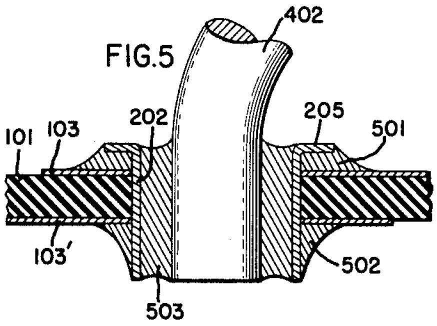
FIGURE 5 is a cross section view of a soldered terminal and headed eyelet.

In FIGURE 5 there is shown the insulated panel 101, pad 103 and 103', eyelet 202 and terminal 402. The solder contained within the solder washer 204 will form a fillet 501 joining the eyelet walls and eyelet head to pad

103. Since the eyelet head 205 is in intimate contact with the solder preform and since the solder preform is in intimate contact with pad 103 because of the mechanical pressure exerted by the punch, no bridging problem exists in making the solder connection. As will be recognized by those skilled in the art, the elimination of the bridging problem is of considerable advantage in the construction of electric circuits. The immersion in the molten solder bath will join the eyelet wall to pad 103' as illustrated by fillet 502. As will be recognized by those skilled in the art, formation of this fillet forming a complete electrical and mechanical bond between the pad 103' and the eyelet wall is enhanced by the close mechanical contact between the pad 103' and the eyelet walls. When a hole is pierced and an eyelet placed therein, this close mechanical contact between the pad and the eyelet wall does not exist and formation of a solder fillet is not certain due to the fact the solder must bridge an air gap. Simultaneously with the formation of fillet 502, the component terminal 402 is mechanically and electrically joined to the eyelet wall 202 by solder 503. This solder is drawn up into the eyelet by capillary action to form a solid solder plug. This plug provides excellent mechanical support for the component terminals as well as completing the electrical circuit. Without the use of an eyelet this plug formation is not possible since the insulating panel will not be "wetted" by the solder.

Figure 6:
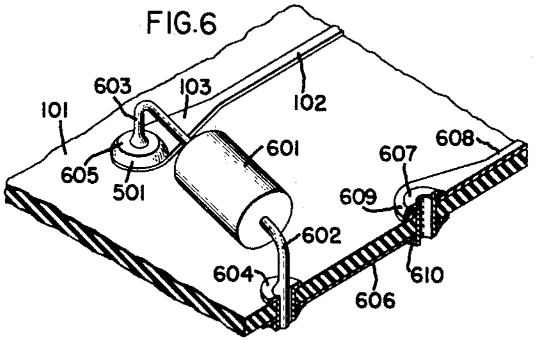
FIGURE 6 is a perspective view of the panel with assembled circuit components.

In FIGURE 6 there is shown a completed circuit having a component 601 mounted on panel 101. The component terminals 602 and 603 are securely mounted within the eyelet 604 and 605 respectively by the solder plug filling the space between the respective terminal and eyelet. The eyelet 605 is bonded both mechanically and electrically to the pad 103 by the solder fillet 501. The conductor run 102 associated with pad 103 connects the component 601 to the components in the assembled circuit.

In many cases it is desirable to have a conductor run on the other side of the board as illustrated by run 606. Such runs are desirable to avoid crowding of conductors on one side of the panel and are necessary for configuration where two conductors must cross without electrical contact. In such cases the eyelet 604 is forced through the panel without a solder pre-form attached and the terminal 602 inserted therein. The eyelet is then bonded electrically and mechanically to the conductor run 606 and the terminal 602 is bonded to the eyelet 604 by a single dip soldering operation.

It will be apparent to those skilled in the art that my invention may be used to interconnect conductors placed on the top and the bottom of the panel without terminal support. This is shown in FIGURE 6 by eyelet 607 which serves to interconnect conductor 608 with conductor 606. A solder pre-formed washer is melted to form the bond shown by fillet 609. The eyelet is bonded to run 606 by fillet 610 which is formed in a dip soldering operation.

Assembly of an electric circuit in accordance with my invention has the advantage of placement of eyelets in a single operation. Since the placed eyelet is secured positioned within the panel, the requirement for such handling equipment or manufacturing steps such as swaging, to prevent dislodging of the placed eyelets is not present. In practice it has been found that this method of placement of eyelets has an ancillary advantage of improving the finished circuit with respect to the problem of conductor separation from the insulated portion of the panel. As will be recognized by those skilled in the art, conductor separation has been a rather serious problem is assembly of electric circuits by methods employed in the prior art. This problem is apparently increased when a punch is used to form a hole in the panel. Insertion of the punch and subsequent withdrawal apparently tends to pull conductor runs from the insulated backing. With my invention the eyelet protects the panel from the adverse effects of punch withdrawal and gives an assembled circuit having improved resistance to conductor separation.

It will be apparent to those skilled in the art that the use of a headed eyelet is not mandatory with my method of assembly. A tube may be used to pierce the panel. Assembly with the use of a tube is shown in FIGURE 7.

Figure 7:
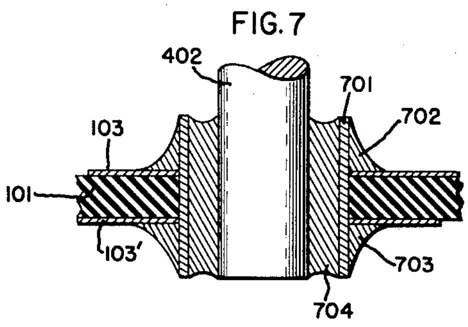
FIGURE 7 is a cross section view of a soldered terminal and tubular eyelet.

In FIGURE 7 there is shown the insulated panel 101 having pads associated with conductor runs. The pads 103 and 103' are joined to the tube walls 701 by fillets 702 and 703 respectively. The component terminal 402 is electrically and mechanically bonded to the interior of the tube walls by solder 704. The upper fillet 702 may be formed by a preformed solder washer frictionally secured to the periphery of the tube. With such arrangements the punch must be controllable in its downward stroke to allow proper positioning of the tube with both ends protruding from the surface. Such controllable stroke punches are well known to the art and no further explanation will be given with respect to such punches in this specification. The use of tubular eyelets instead of headed eyelets has advantage in the piercing of thick panels. With such panels the tube walls can be sufficiently thick to prevent collapse during piercing without the attendant problems associated with heading such thick walled tubular material. On occasion it has been found desirable to eliminate the use of a solder preform around tubular eyelets. In such cases a slightly different dip soldering method may be employed for successful practice of this invention. This method is illustrated in FIGURE 8.

Figures 8, 9:
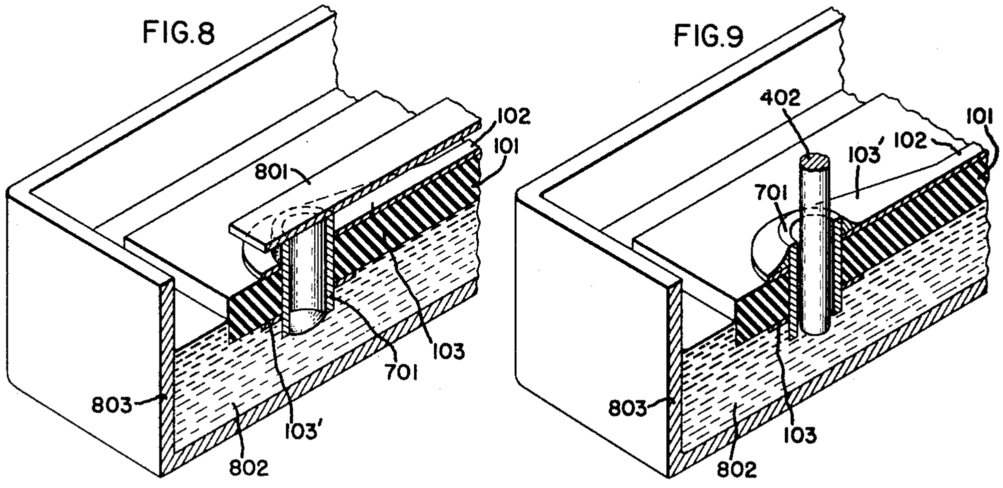
FIGURE 8 is a cross section view illustrating the step of soldering tubular eyelets to the circuit pattern.
FIGURE 9 is a cross section view illustrating the steps of soldering circuit components in tubular eyelets.

In FIGURE 8 there is shown an insulated panel 101 having pads 103 and 103' pierced by tubular eyelet 701. A sheet of high temperature tape 801 is applied on one side of the panel to seal the tubular eyelets. The panel is then immersed in molten solder 802 in container 803 to secure the eyelet walls to the pad 103'. The solder is prevented from filling the center of the eyelet by the air entrapped in the eyelet. The panel is then removed from the solder bath, the tape 801 is removed from the unsoldered side of the panel and component terminals inserted from the soldered side. The panel is then immersed unsoldered side down in a molten solder to bond the eyelet to the pads 103 and to bond the component terminals to the eyelet walls in one operation as shown in FIGURE 9.

In FIGURE 9 there is shown a panel 101 having tubular eyelet 701 within the bore of which is placed component terminals 402. The eyelet is electrically and mechanically bonded to pad 103' by the solder filler formed in the prior dip soldering step. Dip soldering will simultaneously bond the terminal to the eyelet and bond the eyelet to pad 103 both mechanically and electrically.

It will be apparent to those skilled in the art that the eyelet wall thickness will depend upon the thickness and the composition of the panel. I have found that a 1/16-inch thick paper based phenolic insulated panel with 0.003-inch laminated copper conductors on both sides could be pierced successfully in practice by a headed brass eyelet having an 0.006-inch wall thickness. I have also found that a 1/8-inch thick paper base phenolic having 0.003-inch thick copper runs on both sides could be successfully pierced by tubular brass eyelets having a wall thickness of 0.014 inch.

While particular embodiments of the present invention have been shown and described, it will be obvious to those skilled in the art that changes and modifications may be made without departing from the invention in its broader aspects, and therefore, the aim in the appended claims is to cover all such changes and modifications that fall within the true spirit and scope of the invention.

What I claim as new and desire to secure by Letters Patent of the United States is:

1. In the method of assembling an electrical circuit comprising a dielectric panel, circuit components for said panel having elongated terminals, and conductive headed eyelets adapted to receive said elongated terminals and pierce said panel; the steps of forming a solder adherent pattern including a conductive pattern on one side of said panel, placing a solder ring under said eyelet head in frictional engagement with the eyelet wall, piercing said eyelet through said panel at predetermined points on said conductive pattern to protrude from said unpatterned side, inserting the terminals of said circuit components through said eyelets from the patterned side of said panel to protrude from said unpatterned side, and immersing the unpatterned side of said panel in a solder bath whereby said terminal is electrically and mechanically joined to said eyelet and said eyelet is electrically and mechanically joined to said pattern.

2. In the method of assembling an electrical circuit comprising a dielectric panel, circuit components for said panel having elongated terminals, and conductive headed eyelets adapted to receive said elongated terminals and pierce said panel; the steps of forming a solder adherent pattern including a conductive pattern on both sides of said panel, placing a solder washer under said eyelet head in frictional engagement with the periphery of said eyelet wall, piercing said eyelet through said panel at predetermined points on said conductive pattern to have said washer in mechanical contact with said pattern on one side of said panel and to protrude from said other side of said panel through a portion of the pattern thereon, inserting the terminals of said circuit components through said eyelets from the headed side thereof to protrude from the unheaded portion thereof, and immersing the side of said panel from which said eyelets and said terminals protrude in a solder bath to join said terminals to said eyelet and to join said eyelet to said patterns both mechanically and electrically.

3. In the method of assembling an electrical circuit comprising a dielectric panel, circuit components for said panel having elongated terminals, and conductive eyelets adapted to receive said elongated terminals and pierce said panel; the steps of forming a solder adherent pattern including a conductive pattern on both sides of said panel, placing a solder washer on said eyelet in frictional contact with the periphery thereof piercing said eyelets through said panel at predetermined points on said conductive pattern formed on said first side of said panel to protrude from said second side of said panel and to have a portion of said eyelets in an eyelet supporting relation to said panel, inserting terminals of said circuit components through said eyelets from said first side of said panel to protrude from said eyelets on said second side, and immersing said second side of said panel in a solder bath to join said terminals to said eyelets and said eyelets to said patterns.

4. In the method of assembling an electrical circuit comprising a dielectric panel, circuit components for said panel having elongated terminals, and conductive headed eyelets adapted to receive said elongated terminals and pierce said panel; the steps of forming a solder adherent pattern including a conductive pattern on both sides of said panel, placing a solder washer under the head of some eyelets in frictional engagement with the periphery of said eyelet wall, piercing said washer-bearing eyelets through said panel at predetermined points on the pattern on the first side of said panel to have said washer in mechanical contact with said conductive pattern and to protrude from said other side of said panel, inserting the terminals of said circuit components through said eyelets from the headed side thereof to protrude from the unheaded portion thereof, and immersing the side of said panel from which said eyelets and said terminals protrude in a solder bath to join said terminals to said eyelet and to join said eyelet to said patterns both mechanically and electrically.

5. In the method of assembling an electrical circuit comprising a dielectric panel, circuit components for said panel having elongated terminals, and conductive eyelets adapted to receive said elongated terminals and pierce said panel; the steps of forming a solder adherent pattern including a conductive pattern on both sides of said panel, placing a solder washer on some of said eyelets in frictional contact with the periphery thereof, piercing said washer bearing eyelets through said panel at predetermined points on said conductive pattern formed on said first side of said panel to protrude from said second side of said panel and a portion of said eyelets in an eyelet supporting relation to said panel, inserting terminals of said circuit components through said eyelets from said first side of said panel to protrude from said eyelets on said second side, and immersing said second side of said panel in a solder bath to join said terminals to said eyelets and said eyelets to said patterns.

References Cited by the Examiner

UNITED STATES PATENTS

| | | | |
|---|---|---|---|
| 124,346 | 3/72 | Emands. | |
| 605,146 | 6/98 | Stokes | 73—425.4 |
| 673,193 | 4/01 | Callison et al. | |
| 2,120,711 | 6/38 | Phillips | 29—432 |
| 2,129,583 | 9/38 | Johansson | 29—501 |
| 2,307,298 | 1/43 | Przborowski | 29—502 |
| 2,433,384 | 12/47 | McLarn | 29—155.5 X |
| 2,680,824 | 6/54 | Beggs | 29—500 X |
| 2,756,485 | 7/56 | Abramson et al. | 29—155.5 |
| 2,955,351 | 10/60 | McCreadie | 29—155.5 |

JOHN F. CAMPBELL, *Primary Examiner.*

WHITMORE A. WILTZ, *Examiner.*